US012652787B2

(12) United States Patent
Daghighian

(10) Patent No.: US 12,652,787 B2
(45) Date of Patent: Jun. 9, 2026

(54) FLEXIBLE BROADBAND MICROSHIELD FOR ELECTROMAGNETIC INTERFERENCE AND ELECTROSTATIC DISCHARGE

(71) Applicant: Apple Inc., Cupertino, CA (US)

(72) Inventor: Henry M. Daghighian, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 593 days.

(21) Appl. No.: 18/122,635

(22) Filed: Mar. 16, 2023

(65) Prior Publication Data

US 2024/0314992 A1     Sep. 19, 2024

(51) Int. Cl.
*H05K 9/00* (2006.01)

(52) U.S. Cl.
CPC ........... *H05K 9/0083* (2013.01); *H05K 9/006* (2013.01); *H05K 9/0088* (2013.01); *H05K 9/0098* (2013.01)

(58) Field of Classification Search
CPC .................................................. H05K 9/0098
See application file for complete search history.

(56) References Cited

U.S. PATENT DOCUMENTS

| | | | | |
|---|---|---|---|---|
| 2020/0112115 A1* | 4/2020 | Vana, Jr | ............... | H01R 12/771 |
| 2020/0161771 A1* | 5/2020 | Ukei | .................... | B32B 15/046 |
| 2025/0220867 A1* | 7/2025 | Jang | ........................ | H01Q 17/00 |

* cited by examiner

*Primary Examiner* — Hung V Ngo
(74) *Attorney, Agent, or Firm* — BAKERHOSTETLER

(57) ABSTRACT

A multilayer shield is used as an absorber for attenuating electromagnetic radiation (e.g., EMI) includes both metal and ferrite powder layers. Radiation transmitted through one of the metal layers be transmitted to an additional metal layer, and the radiation can be reflected between the metal layers. While reflected by the metal layers, the radiation is absorbed by one of the ferrite powder layers positioned between the metal layers, causing the ferrite powder layer to convert the radiation to thermal energy. Based on energy losses of the radiation due to reflection and thermal energy conversion, the radiation is sufficiently attenuated to limit disruption of nearby transmission signals, including high frequency transmission signals.

20 Claims, 13 Drawing Sheets

820a
834
820b

820n 830a
830b

820m 934a
934b
934c 920a
920b
920c
920d

1120a

1134

1150a

1150b

1120b

1220

1252

1360

1320

1362a

1362b

1362c

FLEXIBLE BROADBAND MICROSHIELD FOR ELECTROMAGNETIC INTERFERENCE AND ELECTROSTATIC DISCHARGE

TECHNICAL FIELD

This application is directed to shields for circuits and connectors, and more particularly, to a multilayer absorber shield for electromagnetic radiation (EMR), electromagnetic interference (EMI), and electrostatic discharge (ESD).

BACKGROUND

Flexible circuits include transmission lines used to carry signals in a variety of applications including radio frequency (RF), telecommunication, and high speed computing. These signals may include signal frequencies in the range of gigahertz (GHz) and above. The impedance (e.g., characteristic impedance) of transmission lines of the flexible circuit that carry the signals should be controlled to within a specified impedance. In order to meet impedance control requirements, a ground reference layer, such as a metal strip or a hatched ground plane, is positioned on the flexible circuit to control the impedance on the flexible circuit transmission lines. Additionally, the metal layer can protect the flexible circuit from EMI from nearby flexible circuits or operational components, as well as protect other nearby flexible circuits and components from EMI generated from the flexible circuit.

Currently, however, flexible circuits are required to carry signals with signal frequencies in the range of GHz, including 20 GHz or more. Moreover, as electronic devices become more complex and, in some cases smaller, several flexible circuits may be stacked in order to fit into relatively small spaces. In some instances, the miniature trace geometries for transmission lines and thin dielectric structure of flex requires hatched copper ground (reference layer). Solid copper metal ground layer transmission line reference plane can no longer be used to meet impedance control requirements. As a result, the signals may undergo reflection along the flexible circuit transmission lines, causing superposition on the original signal and resultant alteration (e.g., distortion) of the signal. In some instances, the metal thickness of the shields can be increased to provide impedance control. However, by increasing the thickness of the shield, the ability flexible circuit to bend decreases and the number of flexible circuits may also decrease. Further, based on the hatch configuration, hatched ground shields includes openings, leading to EMI paths.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

Figure 1:
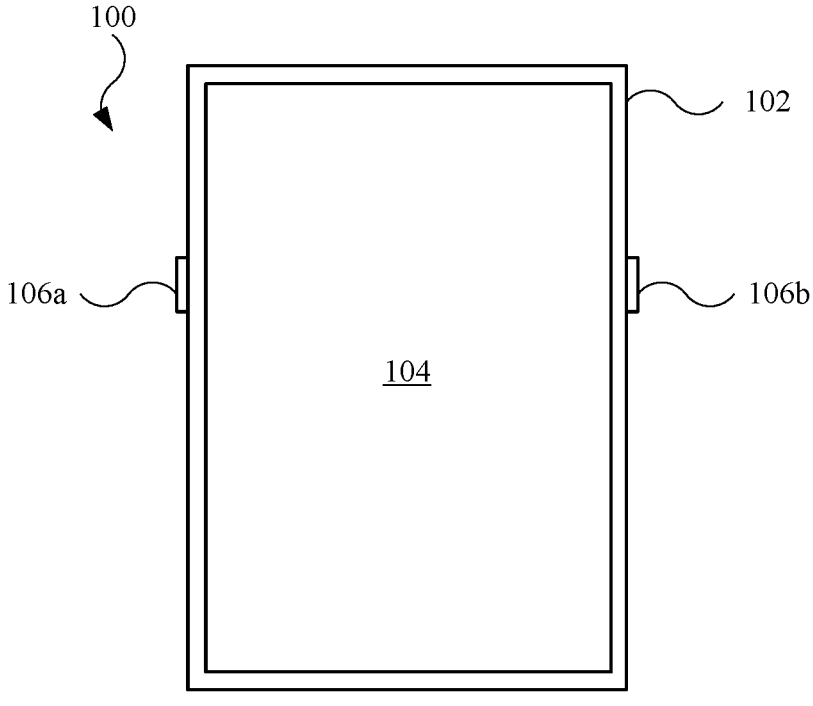
FIGS. 1 and 2 illustrate perspective views of an embodiment of an electronic device, in accordance with aspects of the present disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

The subject technology is directed to shields used to absorb and attenuate EMR (such as EMI), as well as absorb and attenuate ESD. The shields described herein may include multilayer shields with layers of metal and ferrite particles (e.g., ferrite powder). Using multiple layers of different materials (e.g., super high extremely ferromagnetic resonance nano films with high magneto crystalline anisotropy and high electrical conductivity metal multilayer), shields described herein can provide a buffer for electronic structures, such as flexible circuits, from EMI and ESD. Conversely, shields described herein may limit or prevent EMI generated by electronic structures from affecting other nearby electrical components.

Exemplary embodiments of shields may include indium tin oxide (ITO) layers, with spinel nano powder layers between consecutive ITO layers. The term "nano particles" or "nano powders" may refer to the size of individual particles that form a layer. For example, a nano particle layer or nano powder layer may include particles having a diameter approximately in the range of a few nanometers. Further, the powder layers described herein may include different compositions. For example, a layer of spinel nano powder may include manganese (Mn) and zinc (Zn) to form a layer of Mn—Zn ferrite powder with a molecular composition $Mn_{0.5}Zn_{0.5}Fe_2O_4$, where $Fe_2$ is ferrous and $O_4$ is a tetraoxygen molecule. Additionally, a spinel nano powder may include nickel (Ni), copper (Cu) and Zn to form a layer of Ni—Cu—Zn ferrite powder with a molecular composition $Ni_{0.2}Cu_xZn_{0.8-x}Fe_2O_4$. The spinel nano powder layers provide relatively high ferromagnetic resonance frequency designed to absorb and attenuate EMI at high frequencies (e.g., broadband frequencies of 10 GHz or higher) and convert the electromagnetic energy into thermal energy (e.g., heat). Also, multitype nano ferrite film with metal help create an increased impedance mismatch between layers and therefore increased multipath reflections as EMR traverses thru the multilayer thin film. Multiple internal reflections thru ferrite absorbers create attenuation. The metal layer/ferrites provide broadband suppression of EMI together.

The super high magneto crystalline anisotropy of the ferrite nano powders i specified allow for, super high gyromagnetic ratio and ferromagnetic resonance frequencies. The nano powder ferrite chosen acts as super paramagnetic in nature as it is not affected by eddy current losses due to absence of many Weiss domains and grain boundaries. Eddy current losses make normal ferrites become useless in high frequencies. Nano size dense packed ferrites achieve extremely ferromagnetic resonance frequencies due to spin orbit interaction which dominates at high frequencies and causes the damping precession (Larmor precession) at extremely high frequencies. The damping rotation initiated by resonance between EMI frequency and electron spin frequency converts the radiation absorbed thru resonance to heat thru damping orbital motion.

Moreover, the spinel nano powder layers in combination with metal layers are effective at absorbing and attenuating EMI at lower frequencies (e.g., narrowband frequencies of 1 GHz or less). Beneficially, the composition of multilayer shields described herein can be used for a wide range of frequencies and does not need to be modified for a particular frequency range(s). The metal layers can be electrically grounded tied to circuit/chassis ground and provide ESD guard function as well as EMI suppression.

Despite having several layers, shields described herein may include a collective thickness on the order of a few micrometers, or microns. As a result, the relatively small thickness allows the shields to integrate with electronic devices, such as consumer electronic devices (e.g., smartphones). Further, based on their thickness, shields described herein can bend or flex, and thus can be applied to, and bend with, flexible circuits or ground planes, while still providing a specified impedance control for transmission lines on the flexible circuits. The relatively small thickness of shields can be attributed in part to not requiring coarse iron powders and composite polymer base embedded with the powder, results in higher density of ferrite powders in a layer. Moreover, to provide additional EMI attenuation, shields (e.g., micro shields) described herein can be stacked together, and/or may be positioned between multiple flexible circuits. Also, shields can be formed by methods such as thin film deposition, including thin film deposition onto a flexible circuit or an adhesive layer. Other methods such as precision thickness control nano spray, and spin coating, using a emulsion of densely packed nano particle powder in adhesive spray coating is feasible. Metal deposition using magnetron deposition, spray coating, CVD techniques is also feasible. Environmental protective coatings can be further applied on top of the micro shield comprised of polymer, acrylic nanocoats. Further, shields described herein may be used with other shields, including shields of similar composition.

These and other embodiments are discussed below with reference to FIGS. 1-19. However, those skilled in the art will readily appreciate that the detailed description given herein with respect to these Figures is for explanatory purposes only and should not be construed as limiting.

According to some embodiments, for example as shown in FIG. 1, an electronic device 100 is shown. Electronic device 100 may take the form of a mobile wireless communication device, such as a smartphone or a tablet computing device, as non-limiting examples.

As shown, electronic device 100 includes a housing 102 and a display 104 coupled to housing 102. Housing 102 may include metal (including metal alloy), a transparent material (e.g., glass sapphire), or a combination thereof. Display 104 is designed to present visual information, such as textual information, still images, or motion images (e.g., video). Further, display 104 may include a capacitive touch sensitive layer, thus allowing display 104 to receive inputs and/or gestures through interaction with display 104.

Electronic device 100 may further include one or more buttons. For example, electronic device 100 included a button 106a and a button 106b, each of which can be depressed to provide an input to, for example, interact with and alter/update the visual information on display 104. Although buttons 106a and 106b are shown in particular locations, buttons 106a and 106b may generally be positioned in other locations. Also, although buttons 106a and 106b represent a discrete number of buttons, electronic device 100 may include a different number of buttons.

Figure 2:
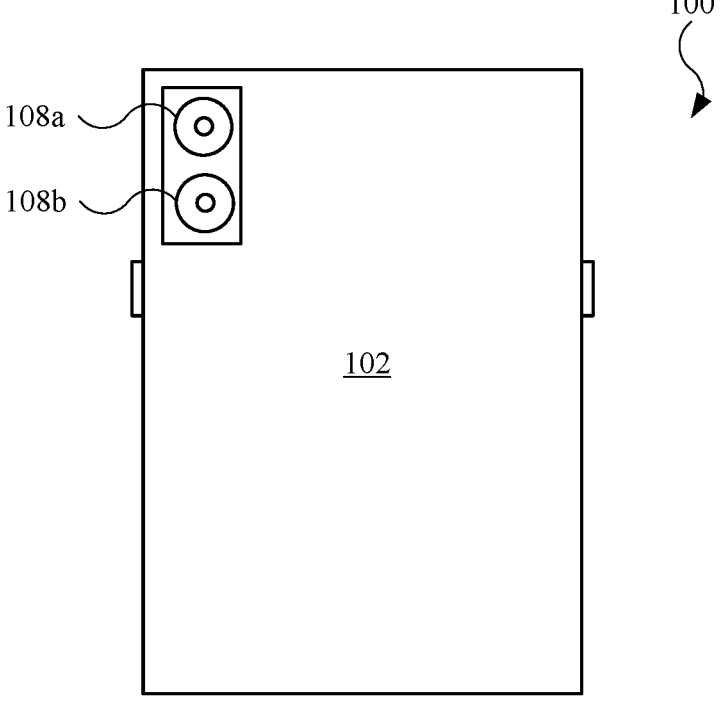

Referring to FIG. 2, a rear view of electronic device 100 shows an image sensor 108a and an image sensor 108b extending from housing 102. In some embodiments, each of image sensors 108a and 108b is a camera designed to capture images (e.g., still or motion) that are external to electronic device 100. Although image sensors 108a and 108b are shown in particular locations, image sensors 108a and 108b may generally be positioned in other locations. Also, although image sensors 108a and 108b represent a discrete number of image sensors, electronic device 100 may include a different number of image sensors.

Figure 3:
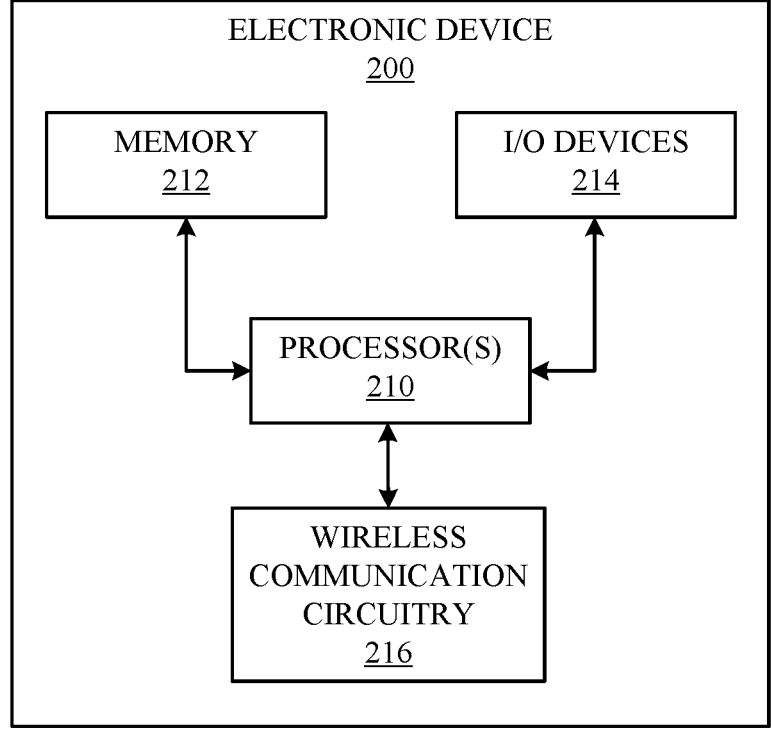
FIG. 3 illustrates a schematic diagram of an electronic device, in accordance with aspects of the present disclosure.

Referring to FIG. 3, a schematic diagram of an electronic device 200 is shown. Electronic device 200 may take the form of various electronic devices. As non-limiting examples, electronic device 200 may include a mobile wireless communication device (e.g., smartphone, tablet computing device), a laptop computing device, a desktop computing device, a standalone display, earphones (e.g., over-the-ear headphones, wireless earbuds), or a video streaming device. Electronic device 200 may include one or more processors 210. One or more processors 210 may include a central processing unit, a graphics processing unit, one or more microcontrollers, one or more application-specific integrated circuits, or a combination thereof. Electronic device 200 further includes a memory circuit 212 that stores instructions and/or algorithms that can be executed by one or more processors. Memory circuit 212 may include read-only memory, random access memory, or a combination thereof.

Electronic device 200 further includes one or more input-output (I/O) devices 214. As non-limiting examples, one or more I/O devices 214 may include a display (e.g., display 104 shows in FIG. 1), buttons (e.g., buttons 106a and 106b shown in FIG. 1), and/or images sensors (e.g., image sensors 108a and 108b shown in FIG. 2).

Also, electronic device 200 may further include wireless communication circuitry 216 that allows electronic device 200 to communicate with other devices (not shown in FIG. 2). Wireless communication circuitry 216 may include cellular network circuitry, WIFI® communication circuitry, BLUETOOTH® communication circuitry, or a combination thereof, as non-limiting examples. Accordingly, wireless communication circuitry 216 may enable broadband communication, including ultra-wide broadband communication in which signal frequencies are 5 GHz or higher, and even 10 GHz or higher.

In order to couple (e.g., electrically couple) one or more processors 210 to each of the one or more I/O devices 214 and the wireless communication circuitry 216, electronic device 200 may include circuits (e.g., flexible circuits) that carry signals (e.g., electrical signals) between these components. The arrows shown in FIG. 3 represent circuits making electrical connection between the components. The aforementioned circuits may carry high frequency signals (e.g., broadband signals), which can generate noise (e.g., EMI, EMR) to which other devices and components, including other circuits, are exposed. Moreover, some circuits may carry static electricity, which can be releases as ESD when the circuit comes into contact with other devices and components, including other circuits. In order to limit or prevent issues related to EMI and ESD, electronic devices shown and described herein may include shields, including shields with electrically grounded metal layers, applied to circuits that electrically couple one or more processors 210 to the components shown and described for electronic device 200.

Figure 4:
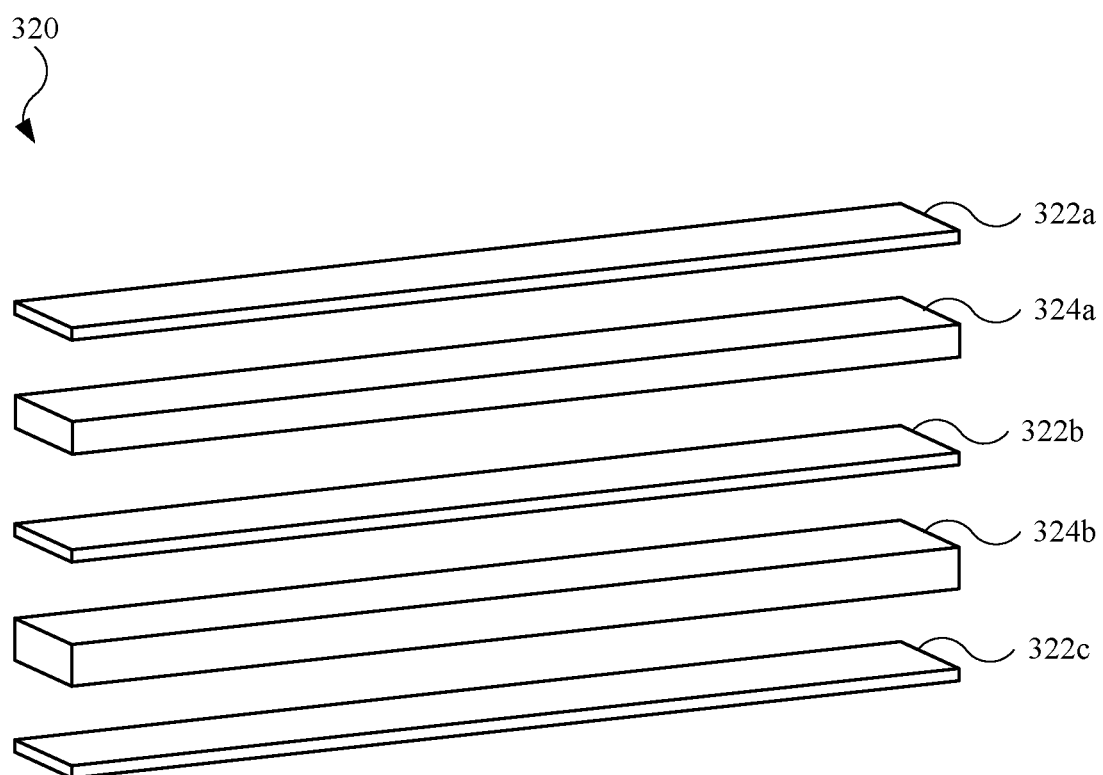
FIG. 4 illustrates an exploded view of an embodiment of a shield, in accordance with aspects of the present disclosure.

Referring to FIG. 4, a shield 320 may include several layers of material. Shield 320 (representative over other shields shown and described herein) can be part of an assembly that is applied to circuits (e.g., flexible circuits) to mitigate issues related to EMI and ESD. Also, based on the several layers (as will be discussed below), shield 320 may be referred to as a multilayer shield. Additionally, due to the relatively small thickness of shield 320 (discussed below), shield 320 may be referred to as a micro shield.

As shown, shield 320 includes a layer 322a, a layer 322b, and a layer 322c. Each of layers 322a, 322b, and 322c may include a metal layer, such as ITO, as a non-limiting example. Accordingly, each of layers 322a, 322b, and 322c may be referred to as a metal layer. By using ITO, each of layers 322a, 322b, and 322c may include a relatively high electrical conductivity. Alternate metals having a relatively high electrical conductivity may be used as well.

Between each of the layers 322a, 322b, and 322c, shield 320 may further include a layer 324a and a layer 324b. For example, layer 324a is positioned between layers 322a and 322b, and layer 324b is positioned between 322b and 322c. Layers 324a and 324b may include ferrite particles (e.g., ferrite nano powder). In some embodiments, each of layers 324a and 324b includes nano powder layers, including spinel nano ferrite powder layers. For example, in some embodiments, layer 324a is made from a molecular composition of Mn—Zn ferrite powder (e.g., $Mn_{0.5}Zn_{0.5}Fe_2O_4$). In some embodiments, layer 324b is made from a molecular composition of Ni—Cu—Zn ferrite powder (e.g., $Ni_{0.2}Cu_xZn_{0.8-x}Fe_2O_4$). Accordingly, layers 324a and 324b may include different compositions of spinel nano ferrite powders. Also, as a result of the different compositions, layers 324a and 324b may include different complex impedance values, thus providing an impedance mismatch between layers 324a and 324b. Additionally, layers 324a and 324b may include relatively high ferromagnetic resonance frequency/gyromagnetic ratio/magneto crystalline anisotropy. These features will be further discussed below. Further, in some embodiments, each of layers 324a and 324b may be referred to as a metal layers based upon their respective compositions. Also, although each of layer 324a and 324b are described as having a ferrite layer of a particular composition, it should be noted that the composition of ferrite layers of layers 324a and 324b can be interchanged.

Layers 324a and 324b may be formed from other materials. For example, at least one of layers 324a and 324b may include a molecular composition of magnesium (Mg) and Zn ferrite. Alternatively, at least one of layers 324a and 324b may include a molecular composition of ferrous oxide derivatives, super paramagnetic materials, or multiferroic materials such as Bismuth ferrous oxide.

Shield 320 can be applied to devices, including noise-emitting devices (e.g., flexible circuits, circuit boards, transmission lines, power lines, connectors, etc.) or ground planes, by various means. For example, each of the aforementioned layers are applied to devices by a deposition operation, such as thin film deposition. Alternatively, each of the aforementioned layers be applied via deposition to an intermediate assembly with adhesive layer, and the shield can subsequently be applied to the device by the adhesive layer.

Figure 5:
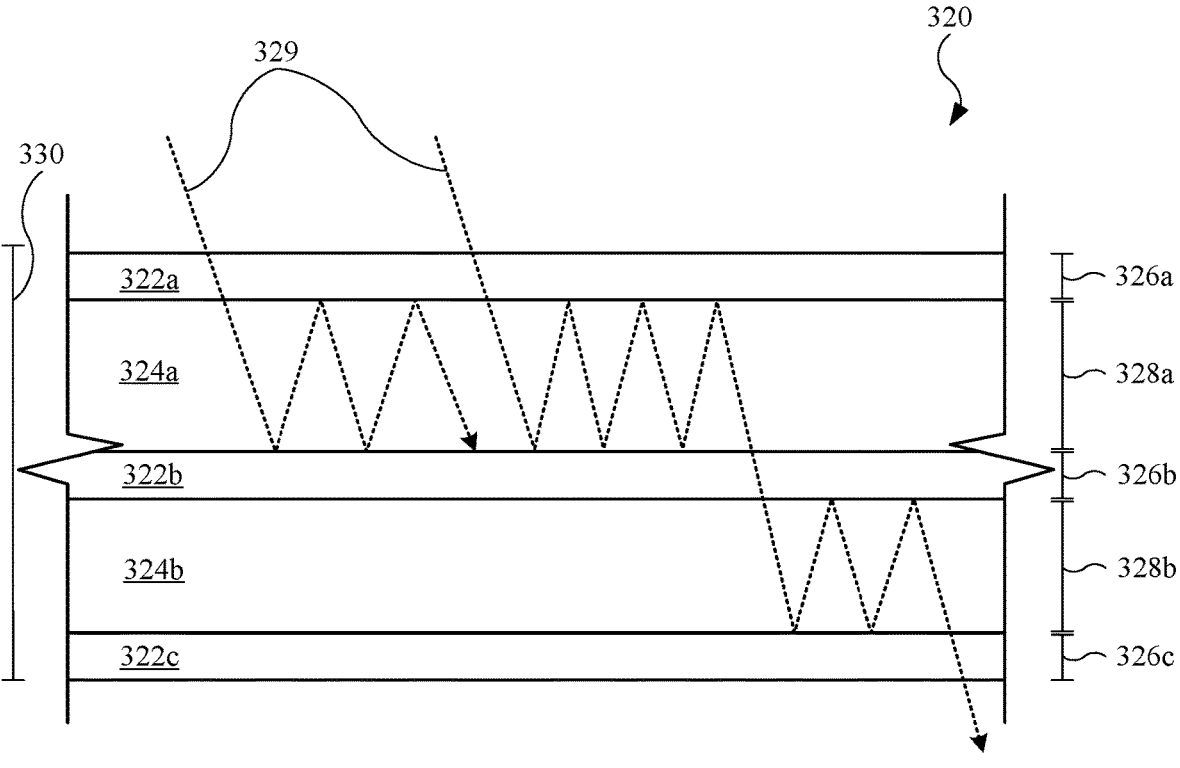
FIG. 5 illustrates a side view of a shield exposed to radiation, in accordance with aspects of the present disclosure.

Referring to FIG. 5, the layers of shield 320 are assembled. As shown, the layers can couple to other adjacent layers. Moreover, some layers can be characterized as overlaying, or covering, other layers. For example, layer 322a overlays layer 322b and layer 322b overlays layer 322c. By overlaying, a layer may cover, and directly engage, a surface of another layer. Conversely, the layers can be characterized as being overlaid, or covered by, other layers. For example, layer 322c is overlaid by layer 322b, and layer 322b is overlaid by layer 322a. By being overlaid, a surface of a layer may be covered, and directly engaged, by another layer. Additionally, layers may separate other layers. For example, layer 324a separates layer 322a from layer 322b, and layer 324b separates layer 322b from layer 322c. Additionally, each of layers 322a, 322b, and 322c can be grounded (e.g., electrically grounded).

Additional characteristics of shield 320 are shown and described. For example, layer 322a, layer 322b, and layer 322c include a dimension 326a (e.g., thickness), a dimension 326b, and a dimension 326c, respectively. Each of dimensions 326a, 326b, and 326c may be approximately in the range of 220 to 280 nanometers. In some embodiments, each of dimensions 326a, 326b, and 326c is 250 nanometers, or at least approximately 250 nanometers. Layer 324a and layer 324b include a dimension 328a (e.g., thickness) and a dimension 328b, respectively. Each of dimensions 328a and 328b may be approximately in the range of 900 to 1300 nanometers. In some embodiments, dimension 328a is 1,200 nanometers and dimension 328b is 1,000 nanometers. Accordingly, in some embodiments, dimension 328a of layer 324a is greater than dimension 328b of layer 324b. The given values of dimensions 328a and 328b may be approximate values. Based on the aforementioned dimensions, shield 320 may include a dimension 330, representing a combined thickness of the layers, approximately in the range of 2.5 to 4 microns. Beneficially, shield 320 is a relatively thin structure that can bend or flex along with, for example, a flexible circuit onto which shield 320 may be applied. Also, shield 320 may represent a single shield in a stack of one or more shields.

FIG. 5 further shows shield 320 exposed to radiation 329 (e.g., EMI energy, EMR energy) represented by dotted lines. The radiation may include high frequency (e.g., broadband, ultra-wide broadband) of 10 GHz or higher. As shown, layer 322a (e.g., a top layer) may transmit an amount of radiation 329 therethrough, thus allowing radiation 329 to enter layer 324a. An "amount" of radiation 329 may refer to some fraction that is less all of the radiation to which layer 322a is exposed. Layer 322b may be exposed to radiation 329. In this regard, radiation 329 (e.g., transmitted radiation or transmitted EMR) can be reflected several times between layers 322a and 322b. Thus, layers 322a and 322b may be referred to as reflector layers. With each reflection by layers 322a and 322b, radiation 329 passes through layer 324a. While radiation 329 pass through layer 324a, layer 324a can absorb at least some of radiation 329 (e.g., reflected radiation or reflected EMR) and convert radiation 329 (e.g., absorbed radiation or absorbed EMR) into thermal energy. Due in part to the high ferromagnetic resonance of layer 324a, the electrons of the particles of layer 324a resonate at high frequencies, causing rotation of the electrons. Radiation 329 can couple with the rotation of the electrons, causing the energy conversion of radiation energy to thermal energy. As a result, the energy conversion attenuates radiation 329.

The super high magneto crystalline anisotropy of the ferrite nano powders i specified allow for, super high gyromagnetic ratio and ferromagnetic resonance frequencies. The nano powder ferrite chosen acts as super paramagnetic in nature as it is not affected by eddy current losses due to absence of many Weiss domains and grain boundaries. Eddy current losses make normal ferrites become useless in high frequencies. Nano size dense packed ferrites achieve extremely ferromagnetic resonance frequencies due to spin orbit interaction which dominates at high frequencies and causes the damping precession (Larmor precession) at extremely high frequencies. The damping rotation initiated by resonance between EMI frequency and electron spin frequency converts the radiation absorbed thru resonance to heat thru damping orbital motion.

While some of radiation 329 may be full absorbed by layer 324a, some amount of radiation 329 may transmit through layer 322b. As shown, layer 322b may transmit some of the radiation 329 therethrough, thus allowing radiation 329 to enter layer 324b. Radiation 329 can be reflected several times between layers 322b and layer 322c (also used as a reflector layer), causing radiation 329 to pass through layer 324b with each reflection. Similar to layer 324a, layer 324b can absorb at least some of radiation 329 and convert radiation 329 into thermal energy. Although, not explicitly shown, radiation 329 reflected between layers 322b and 322c may be transmitted through layer 322b, where radiation 329 is again reflected between layers 322a and 322b and absorbed by layer 324a. The EMR/EMI radiation can be shielded by metal layers as well besides being reflected. Electrically grounded metal layers in the stack (e.g., layers 322a, 322b, and 322c, as well as layers 324a and 324b) can be more effective and also work on shielding against. ESD.

Also, based upon the different composition of layers 324a and 324b, the respective impedances values differ. Accordingly, layer 324a includes an impedance value and layer 324b includes a different impedance value, creating an impedance mismatch. In this regard, the radiation passing through layer 324a is exposed to an impedance value based on layer 324a, and when passing through layer 324b, radiation 329 is exposed to a different impedance value based on layer 324b. Beneficially, by using different compositions for layers 324a and 324b to create the impedance mismatch, the reflection of radiation 329 increases (as opposed to layers with the same impedance values), causing additional opportunity for absorption by layers 324a and 324b, resulting in additional attenuation of radiation 329. Also, radiation 329 that is fully transmitted through shield 320 may attenuated sufficiently so to not cause interference to a stricture (not shown in FIG. 5) onto which shield 320 is attached.

When shield 320 is stack on another shield (not shown in FIG. 5) that is similar to shield 320, the similar shield can further absorb and attenuate radiation 329. For example, while shield 320 can reduce both reflection and transmission (in terms of decibels, or dB), using two or more, and even five or more shields, can further reduce both reflection and transmission.

Although not expressly shown, radiation 329 may enter shield 320 through layer 322c (e.g., a bottom layer of shield 320). An amount of radiation 329 transmitted through layer 322c may be reflected by layers 322b and 322c, while being absorbed by layer 324b. Further, an additional amount of radiation 329 transmitted through layer 322b may be reflected by layers 322a and 322b, while being absorbed by layer 324a.

Figure 6:
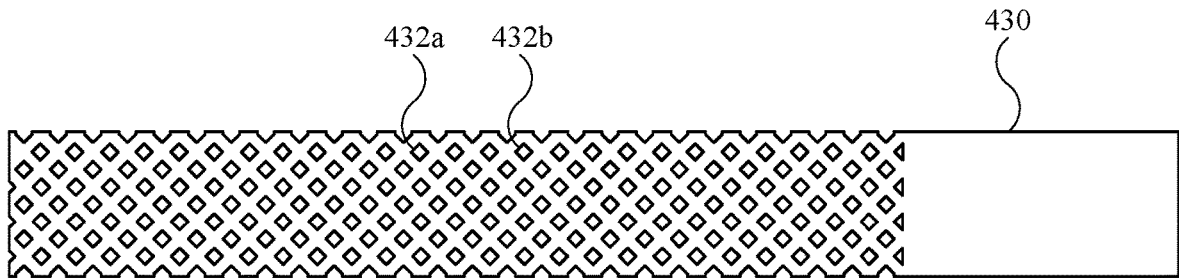
FIG. 6 illustrates a plan view of a hatched ground plane, in accordance with aspects of the present disclosure.

Referring to FIG. 6, a ground plane 430 is shown. Ground plane 430 may include a metal, such as copper. As shown, ground plane 430 includes several openings, such as an opening 432a and an opening 432b (representative of several additional openings). In this regard, ground plane 430 may take the form of a hatched ground plane. The openings may form a lattice or crosshatch, allowing ground plane 430 to bend or flex, which may be beneficial when ground plane 430 is attached to a flexible circuit. While ground plane 430 provides shielding over a frequency range, ground plane 430 alone may be insufficient for impedance control and shielding/isolation at relatively higher frequencies, due in part to the hatch configuration. However, shields described herein may be used with one or more grounds planes (similar to ground plane 430), and the combination provides desired impedance control and noise shielding. This will be shown and described below.

Figure 7:
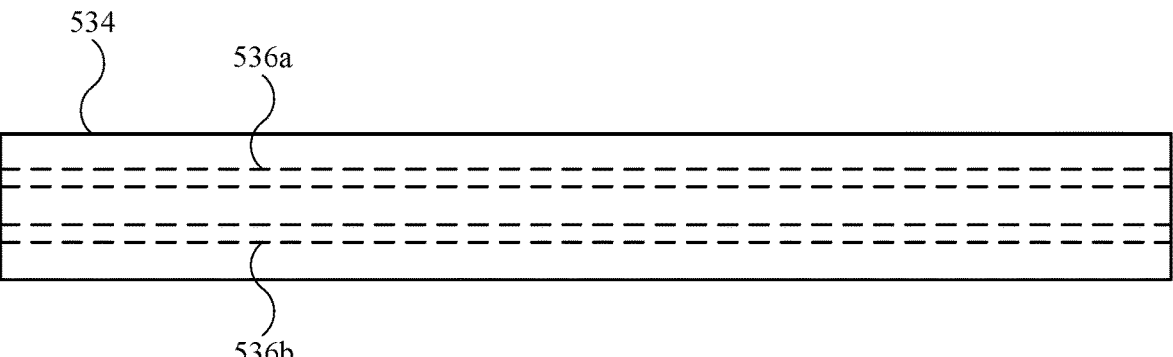
FIG. 7 illustrates a plan view of a circuit, in accordance with aspects of the present disclosure.

Referring to FIG. 7, an example of a circuit 534 is shown. In some embodiments, circuit 534 is a flexible circuit. As shown, circuit 534 includes a transmission line 536a and a transmission line 536b. In some embodiments, transmission line 536a is a signal line and transmission line 536b is a ground line. In some embodiments, transmission lines 536a and 536b form a differential pair used in differential signaling for high speed transmission.

Figure 8:
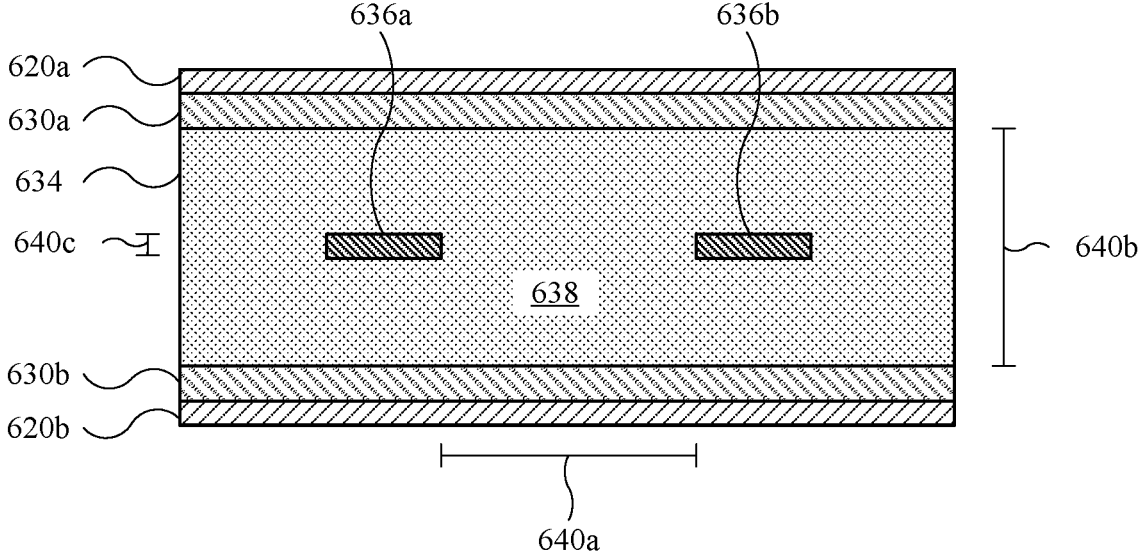
FIG. 8 illustrates a cross sectional view of a circuit surrounded by hatched ground planes and shields, in accordance with aspects of the present disclosure.

Referring to FIG. 8, a cross sectional view of a circuit 634 is shown, with the circuit 634 surrounded by a ground plane 630a and a ground plane 630b. Ground planes 630a and 630b may include any features shown and described herein for a ground plane. Additionally, circuit 634 is further surrounds by a shield 620a and a shield 620b. Shields 620a and 620b may include any features shown and described herein for a shield. As shown, shield 620a and shield 620b is applied to ground plane 630a and ground plane 630b, respectively.

As shown, circuit 634 includes a transmission line 636a and a transmission line 636b, and a dielectric material 638 in which the transmission line 636a and 636b are embedded. As a non-limiting example, dielectric material 638 may include polyimide. Dielectric material 638 Transmission lines 636a and 636b may form a differential pair. Transmission lines 636a and 636b are separated by a dimension 640a (e.g., separation distance) approximately in the range of 100 to 140 microns. In some embodiments, dimension 640a is 120 microns. Additionally, circuit 634 includes a dimension 640b (e.g., thickness of dielectric material 638) approximately in the range of 60 to 100 microns. In some embodiments, dimension 640b is 80 microns. Also, each of transmission lines 636a and 636b includes a dimension 640c (e.g., thickness) approximately in the range of 5 to 10 microns. In some embodiments, dimension 640c is 7 microns.

Based on the various dimensional relationships of circuit 634, issues related to noise and impedance control may occur. However, by using shields 620a and 620b and ground planes 630a and 630b, these issues can be managed. For example, by controlling impedance, transmission lines 636a and 636b may maintain their relatively small size. Beneficially, circuit 634 can be made smaller and more compact, without sacrificing signal distortion. Additionally, dimension 640b of circuit 634 is relatively small. However, shields 620a and 620b, along with ground planes 630a and 630b, can minimize noise generated by transmission lines 636a and 636b such that noise passing through shields 620a and 620b does not affect other nearby devices. Further, while dimension 640a is relatively small, cross talk between transmission lines 636a and 636b may be limited so as to not affect the signals, including high speed broadband or ultra-wide broadband signals, on transmission lines 636a and 636b.

When observing an electric field and magnetic field versus frequency (of radiation), both the electric field and the magnetic field is decreased with a combination of a ground plane (e.g., hatched ground plane) and a shield, or shields, described herein. This includes high frequency radiation of 10 GHz or higher.

Figure 9:
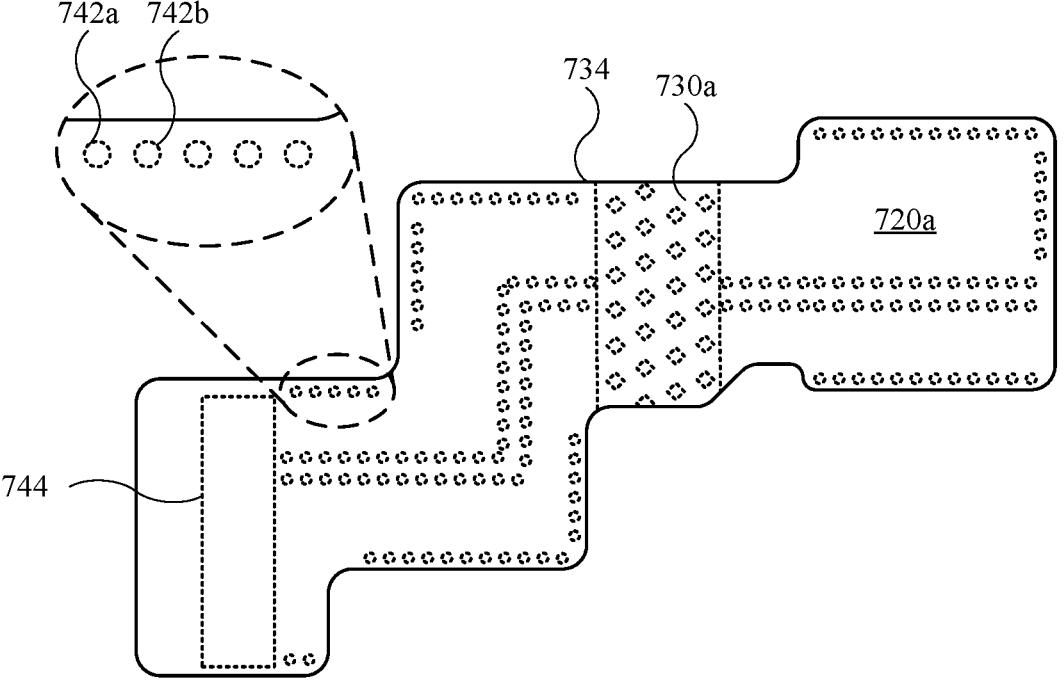
FIGS. 9 and 10 illustrate a circuit and a connector, showing ground planes and shields covering the circuit and the connector.
Figure 10:
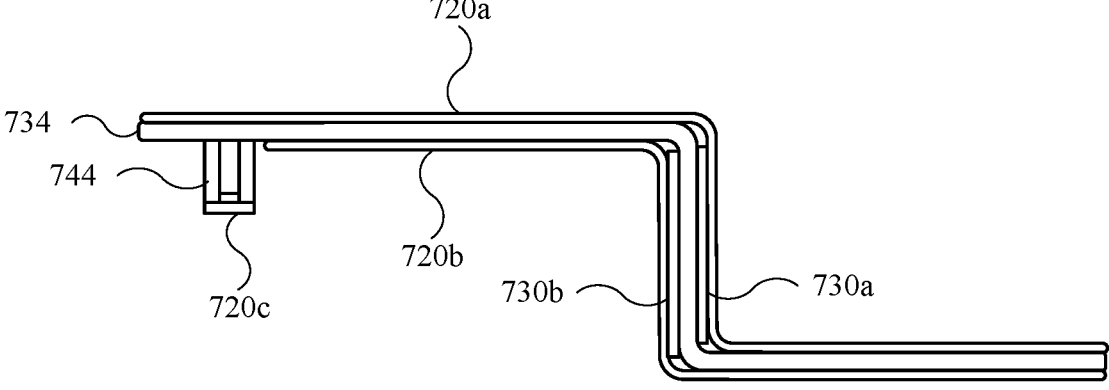

Referring to FIGS. 9 and 10, a circuit 734 is shown. In some embodiments, circuit 734 is a flexible circuit. Each surface of circuit 734 is covered by a shield 720a and a shield 720b (as shown in FIG. 10). Each of shields 720a and 720b may include any features shown and described herein for a shield. Additionally, a ground plane 730a and a ground plane 730b may cover opposing surfaces of circuit 734. Each of ground planes 730a and 730b may include any features shown and described herein for a ground plane, including a hatched ground plane. As shown in FIG. 10, ground planes 730a and 730b are located at a bend region of circuit 734, and are covered by shields 720a and 720b, respectively.

Circuit 734 further includes several vias, covered by shields 720a and 720b, used to form electrical connections between layers (e.g., copper layers) of circuit 734. As shown, in the enlarged view in FIG. 9, circuit 734 includes a via 742a and a via 742b, which are representative of additional vias. Additionally, circuit 734 includes a connector 744 designed to connect to other circuits, including respective connector of the other circuits. A shield 720c can be applied to connector 744. Shield 720c may include any features shown and described herein for a shield.

While circuit 734 is used to transmit signals, including high speed signals, the vias and connector 744 can each radiate, generating noise that emanates from circuit 734. While ground planes 730a and 730b provide some impedance control and noise reduction, ground planes 730a and 730b may provide a lossy ground. Beneficially, however, shields 720a and 720b can provide noise attenuation by absorbing the noise from the vias, thus preventing circuit 734 from generating unwanted noise that interferes with other nearby devices and circuits. Similarly, shield 720c can absorb noise generated by connector 744.

FIGS. 11-15 show and describe additional implementations of one or more shields that may include any features shown and described herein for a shield. Additionally, while ground planes are not shown, the implementations of shields shown and described in FIGS. 11-15 may be combine with one or more ground planes. Also, the prior embodiments of circuits, ground planes, and shields may be modified to include at least some characteristics and features of shields shown and described in FIGS. 11-15.

Figure 11:
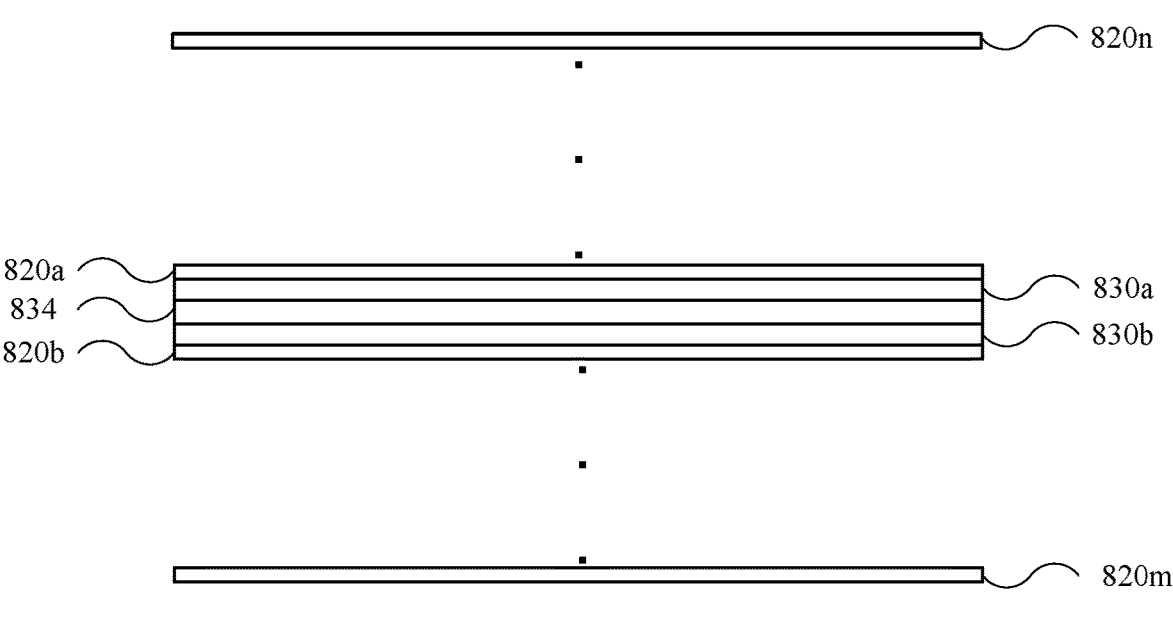
FIG. 11 illustrates a side view of a circuit surrounded by ground planes and multiple, stacked shields, in accordance with aspects of the present disclosure.

Referring to FIG. 11, a circuit 834 includes a ground plane 830a and a shield 820a covering a surface of circuit 834, as well as a ground plane 830b and a shield 820b covering an opposing surface of circuit 834. Also, a shield 820n, along with shield 820a, covers the surface of circuit 834, and a shield 820m, along with shield 820b, covers the opposing surface of circuit 834. In this regard, shield 820n is representative of n shields covering the surface of circuit 834, while shield 820m is representative of m shields covering the opposing surface of circuit 834. The letters n and m may include an integer of two or more. For example, shields 820n and 820m may represent the nth shield and the mth shield, respectively, in a stack of shields. In some embodiments, n and m are equal in value, but can differ if desired. Beneficially, by stacking shields together, noise absorption and attenuation can increases. For example, increasing the number of shields to two shields has been shown to decrease transmission, in dB, of EMI by 50%, while increasing the number of shields to five shields has been shown to decrease transmission, in dB, of EMI by 100%. Also, due in part to the thickness of a shield being in the range of a few microns, a stack of shields still retains flexibility to move or bend with a circuit, as the overall thickness of an assembly of shields may be approximately 20 microns or less.

Figure 12:
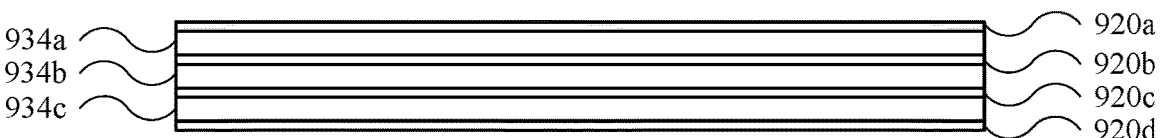
FIG. 12 illustrates a side view showing a stack of circuits and shields, in accordance with aspects of the present disclosure.

Referring to FIG. 12, a series of circuits and shields can be stacked together. For example, a shield 920a and a shield 920b cover opposing surfaces of a circuit 934a. Further, a shield 920b and a shield 920c cover opposing surfaces of a circuit 934b. Also, a shield 920c and a shield 920d cover opposing surfaces of a circuit 934c. The aforementioned shields can absorb and attenuate noise of the multiple circuits. Beneficially, circuits can be stacked to increase transmission and/or to accommodate devices (e.g., consumer electronic device) that have relatively small space for circuits. For example, electronic device 200 (shown in FIG. 2), having one or more I/O devices 214, can stack circuits 934a, 934b, and 934c (as well as other circuits, if needed) to connect to each of the one or more I/O devices 214. Although not expressly shown, multiples shields can be combined (e.g., as shown in FIG. 11) and placed between consecutive circuits.

Figure 13:
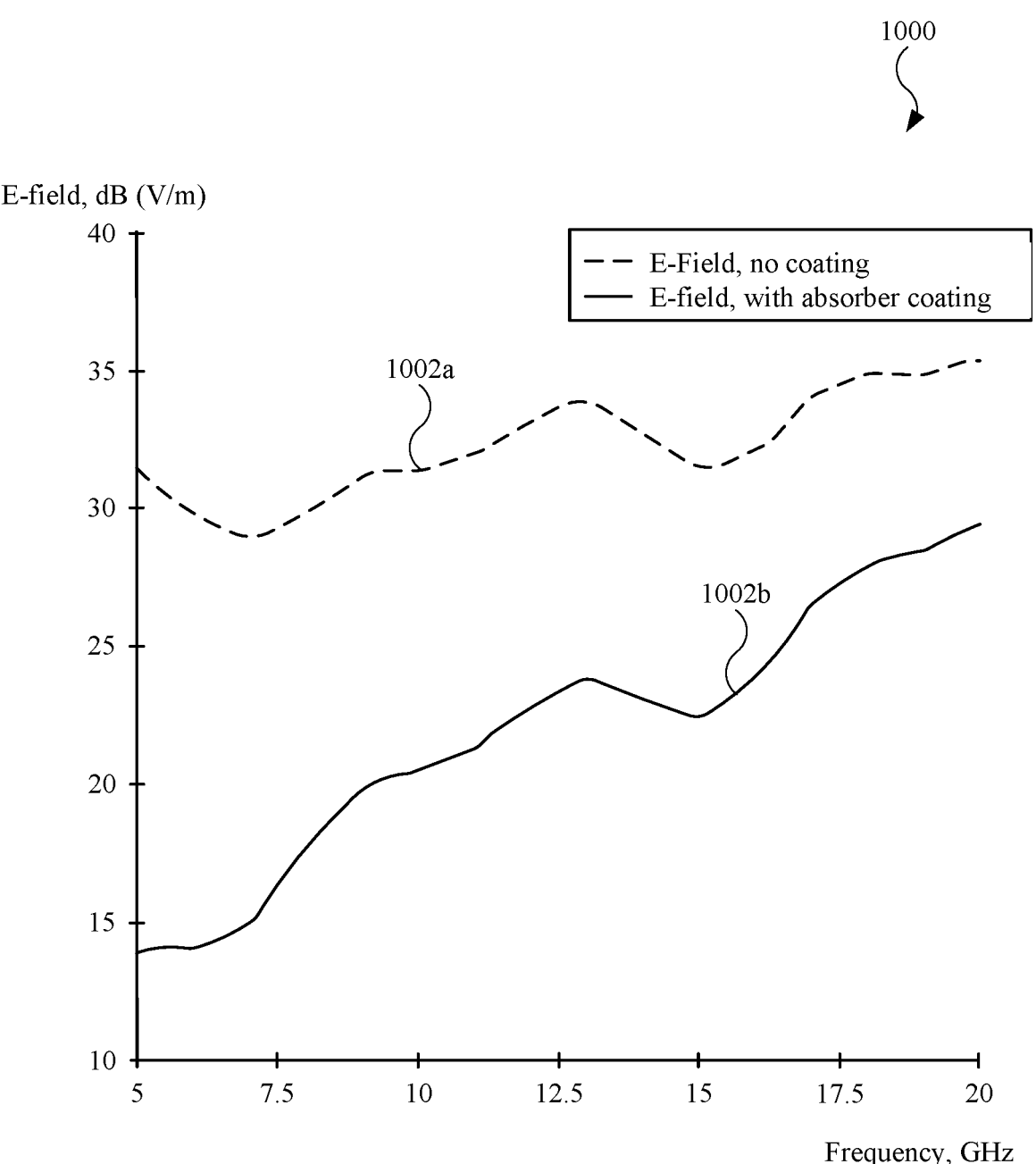
FIG. 13 illustrates a graph of electric field versus frequency with and without using a shield, in accordance with aspects of the present disclosure.
Figure 14:
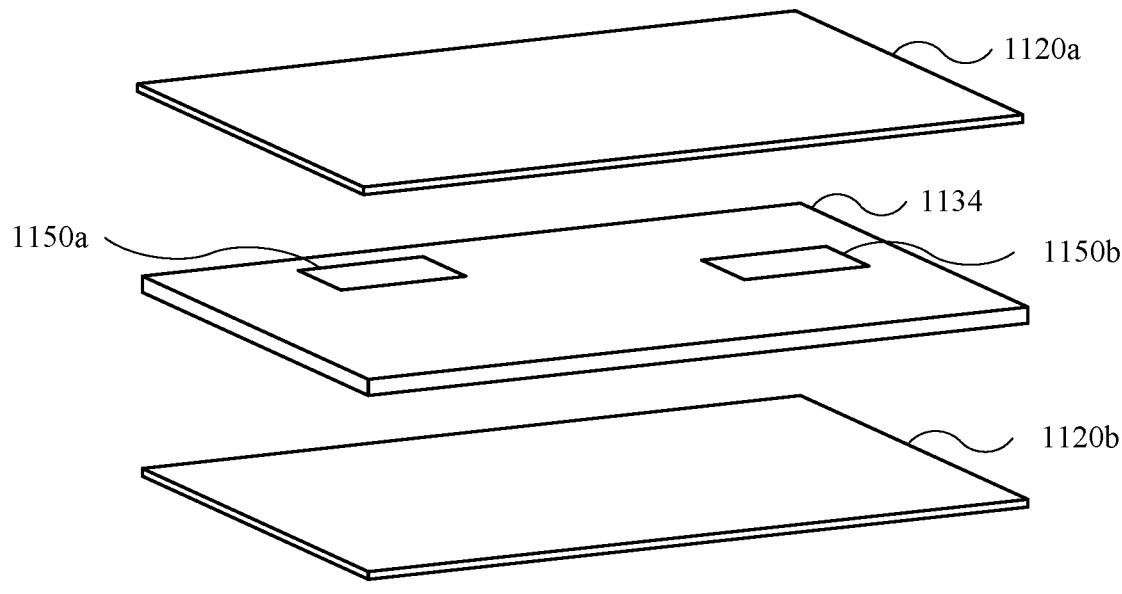
FIG. 14 illustrates an exploded view of a circuit board and multiple shields, in accordance with aspects of the present disclosure.

Referring to FIG. 13, a graph 1000 of electric field (E-field) versus frequency is shown. The E-field may be generated by a differential pair shown and described herein. A plot 1002a shows an E-field versus frequency using a hatched ground plane to attenuate the E-field. Further, a plot 1002b shows an E-field versus frequency using both a hatched ground plane and a shield (e.g., micro shield shown and described herein) to attenuate the E-field. Based on the graph 1000, it can be seen that the E-field is lower when a shield is used with a hatched ground plane, as opposed to using only the hatched ground plane.

At frequencies below 10 GHz, plots 1002a and 1002b show a significant reduction in the E-field when a shield is used with a hatched ground plane. Moreover, when the frequency is 10 GHz (associated with broadband frequencies), plots 1002*a* and 1002*b* show the combination of the shield and the hatch ground plane (associated with plot 1002*b*) can reduce the E-field by 10 dB. As a result, using the shield can limit an E-field from a differential pair, thus limiting exposure of the E-field to other nearby components.

In addition to circuits (e.g., flexible circuits), shields can be applied to other types of circuits. For example, referring to FIG. 14, a circuit 1134 may include a shield 1120*a* and a shield 1120*b* on opposing surfaces of circuit 1134. In some embodiments, circuit 1134 is a printed circuit board (PCB) or a logic board. When implemented as a PCB or a logic board, circuit 1134 may include one or more operational components, such as a component 1150*a* and a component 1150*b*, that are sensitive to EMI. In some embodiments, each of components 1150*a* and 1150*b* includes a processor circuit, such as a central processing unit or an application-specific integrated circuit, as non-limiting examples. Beneficially, shields 1120*a* and 1120*b* may absorb and attenuate noise to limit or prevent components 1150*a* and 1150*b* from, for example, EMI exposure. Alternatively, shields 1120*a* and 1120*b* may absorb and attenuate EMI generated from components 1150*a* and 1150*b*.

Figure 15:
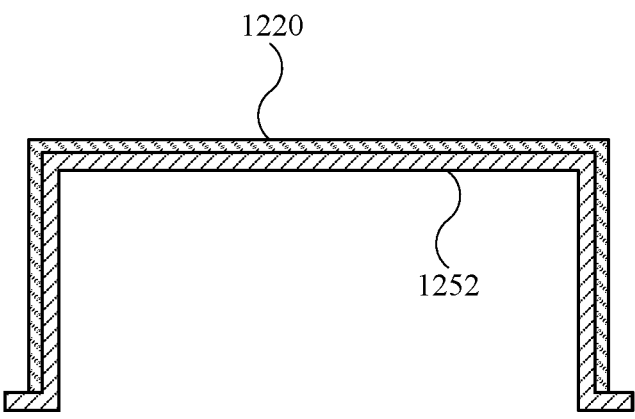
FIG. 15 illustrates a cross sectional view of a can with a shield, in accordance with aspects of the present disclosure.

Referring to FIG. 15, a can 1252 is covered by a shield 1220. Can 1252 may take the form of an EMI gasket or EMI shield. In some embodiments, when can 1252 is exposed to high frequency signals, the signals generates pulses in can 1252, causing a potential difference (e.g., voltage difference) in can 1252, causing can 1252 to radiate. Beneficially, however, shield 1220 can cover can 1252, and absorb and attenuate the high frequency signals to limit or prevent can 1252 from radiating and causing noise that distorts signals from other devices.

Figure 16:
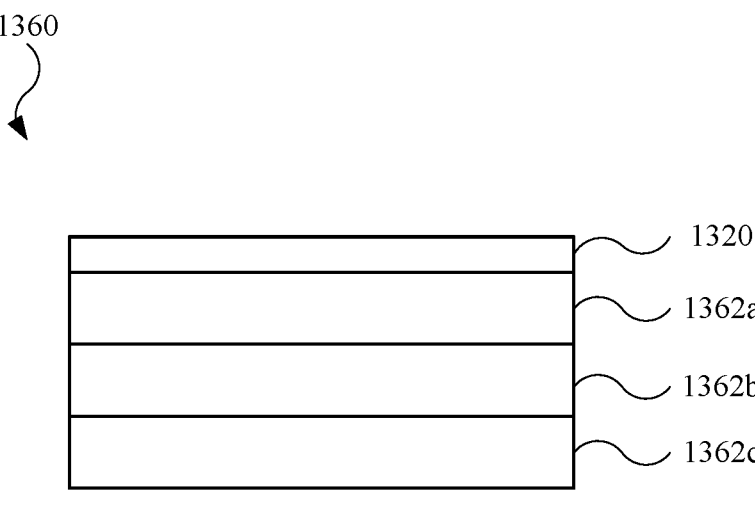
FIG. 16 illustrates a perspective view of a shield with an assembly that includes an adhesive, in accordance with aspects of the present disclosure.

Referring to FIG. 16, an assembly 1360 includes several layers of material, which allows assembly 1360 to be used as a base for shields described herein. Assembly 1360 may include a layer 1362*a*, a layer 1362*b*, and a layer 1362*c*. Further, a shield 1320 is applied (e.g., via thin film deposition) to layer 1362*a* of assembly 1360.

In some embodiments, layer 1362*a* is a polyimide film. In this regard, layer 1362*a* may be used as a base layer for a circuit (e.g., flexible circuit). In some embodiments, layer 1362*b* is an adhesive layer and layer 1362*c* is a release film. As a result, when layer 1362*c* is removed from layer 1362*b*, layer 1362*b* is exposed and assembly 1360 can use layer 1362*b* to secure (e.g., adhesively secure) to another device (e.g., flexible circuit, housing, or other structural component). Further, by carrying shield 1320 (which may represent multiple, additional shields), assembly 1360 provides another process for incorporating shield 1220, alternative to directly depositing layers of shield 1320 onto a device or component.

Figure 17:
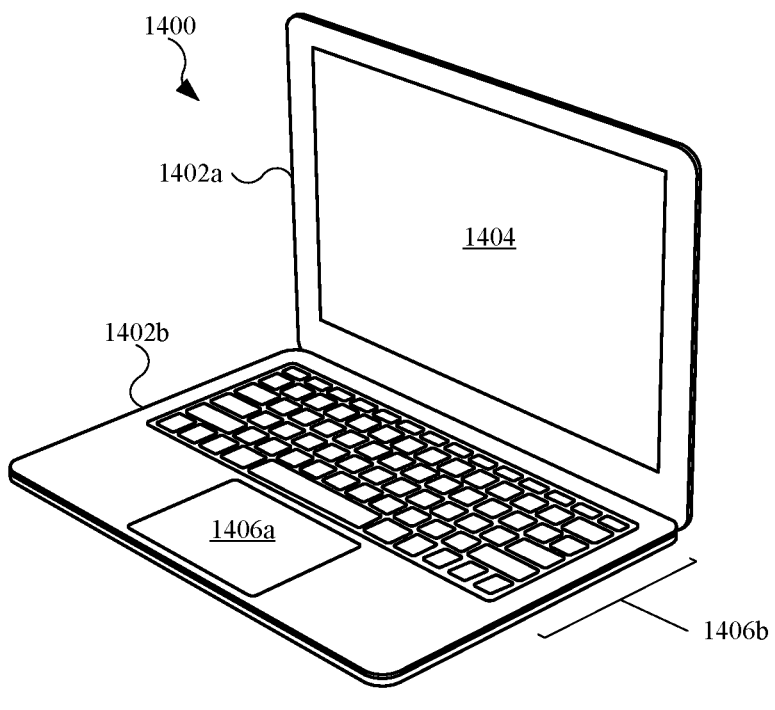
FIGS. 17 and 18 illustrate alternative embodiments of electronic devices, in accordance with aspects of the present disclosure.
Figure 18:
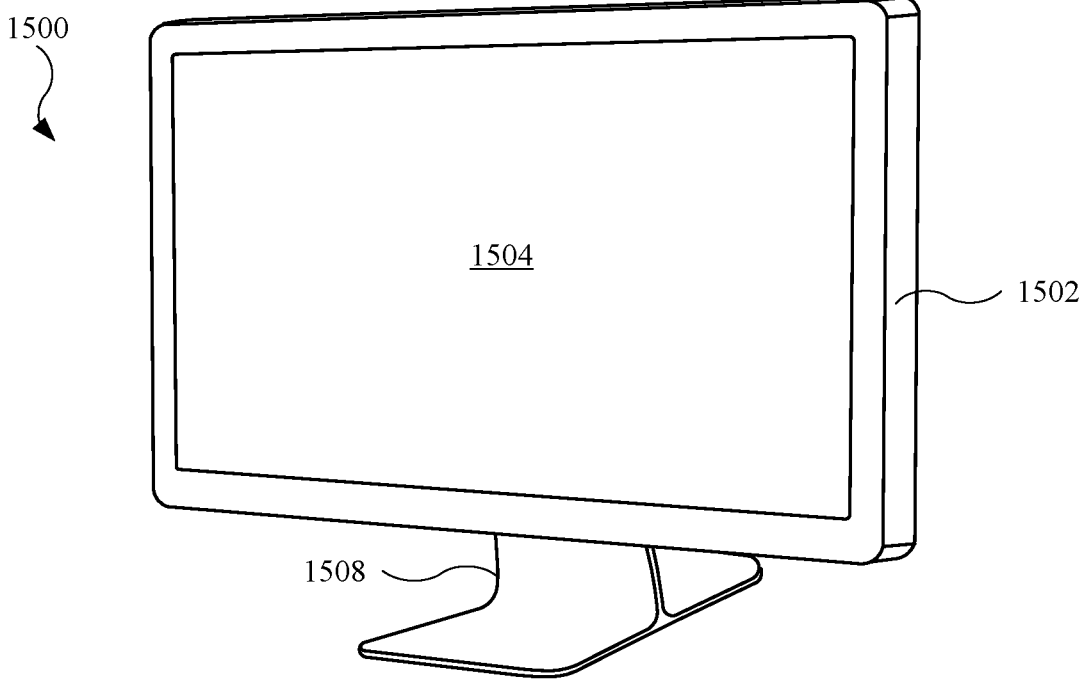

FIGS. 17 and 18 show alternate embodiments of electronic devices in which shields shown and described herein may be incorporated. The electronic devices shown and described in FIGS. 17 and 18 are exemplary, and other electronic devices (earphones (including over-the-ear headphones and wireless earbuds), or a video streaming device.

Referring to FIG. 17, an electronic device 1400 takes the form of a laptop computing device. Electronic device 1400 includes a housing component 1402*a* (e.g., display housing) and a housing component 1402*b* (e.g., base). The housing components 1402*a* and 1402*b* may be rotationally coupled together, thus allowing relative rotational movement between housing components 1402*a* and 1402*b*. As shown, housing component 1402*a* carries a display 1404 designed to present visual information, while housing component 1402*b* carries an input mechanism 1406*a* (e.g., track pad)

and an input mechanism 1406*b* (e.g., keyboard). Although not shown, processing circuitry of electronic device 1400 can be electrically connected to display 1404 and to input mechanisms 1406*a* and 1406*b* using circuits (e.g., flexible circuits), each of which may include one or more shields shown and described herein.

Referring to FIG. 18, an electronic device 1500 takes the form of a desktop computing device or a standalone display. Electronic device 1500 includes a housing 1502 (e.g., display housing) and a stand 1508. Housing 1502 and stand 1508 may be rotationally coupled together, thus allowing relative rotational movement between housing 1502 and stand 1508. As shown, housing 1502 carries a display 1504 designed to present visual information. Although not shown, processing circuitry can be electrically connected to display 1504 using circuits (e.g., flexible circuits), each of which may include one or more shields shown and described herein.

Figure 19:
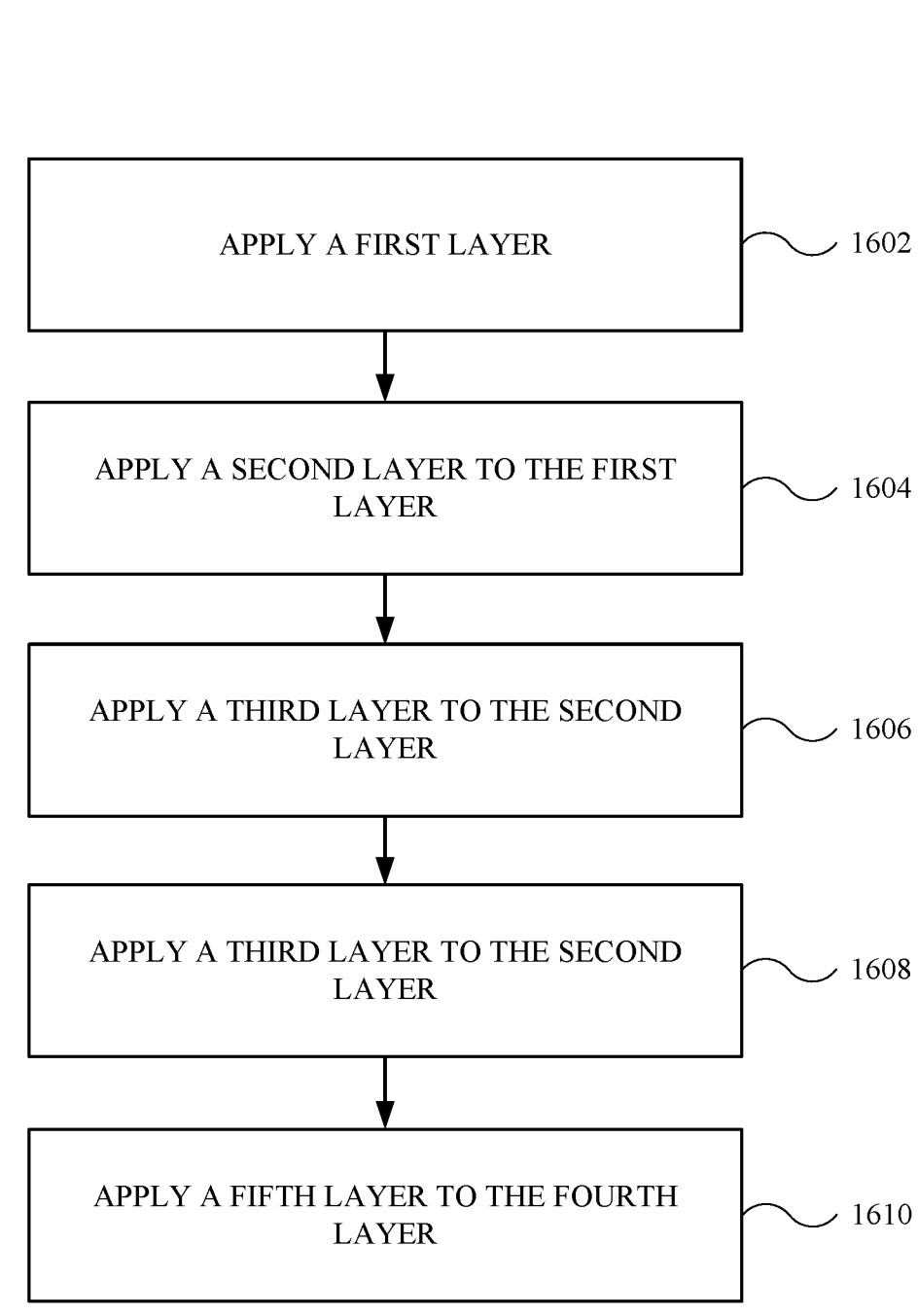
FIG. 19 illustrates a flowchart showing a method for forming a shield, in accordance with aspects of the present disclosure.

Referring to FIG. 19, a flowchart 1600 showing a method for forming a shield is shown, in accordance with aspect of the present disclosure. Flowchart 1600 may be carried out by a deposition operation (e.g., thin film deposition). In this regard, machine tools that can carry out operations such as spray technology, including nano spray technology (e.g., ultrasonic nano spray technology), acrylic nano binding, metal deposition, plasma enhanced chemical vapor deposition, and/or evaporation may be used to carry out flowchart 1600. Exemplary machine tools include planetary thin film rotation systems. In this regard, flowchart 1600 may represent an exemplary method of manufacturing one or more shields shown and/or described herein.

In step 1602, a first layer is applied. The first layer may include ITO or other electrically conductive particles. The first layer may be applied directly to a circuit (e.g., flexible circuit, PCB) or to an assembly with an adhesive.

In step 1604, a second layer is applied to the first layer. In this regard, respective surfaces of the first layer and second layer may engage each other. The second layer may include a powder, including spinel nano powder. The second layer may include a relatively high ferromagnetic resonance. For example, the second layer may include Mn—Zn ferrite powder, Ni—Cu—Zn ferrite powder, Mg—Zn ferrite, ferrous oxide derivatives, super paramagnetic materials, or multiferroic materials. Further, the second layer may include a different thickness as compared to the first layer. For example, in some embodiments, the second layer includes a thickness that is greater than that of the first layer.

In step 1606, a third layer is applied to the second layer. In this regard, respective surfaces of the second layer and third layer may engage each other. Similar to the first layer, the third layer may include ITO or other electrically conductive particles. The first and third layers may be used as reflector layers, and radiation transmitted through one of the first and third can be repeatedly reflected between the first and third layers, thus allowing the radiation to be transmitted through and absorbed by the second layer. The second layer can convert the radiation energy to thermal energy.

In step 1608, a fourth layer is applied to the third layer. In this regard, respective surfaces of the third layer and fourth layer may engage each other. The fourth layer may include powder with materials similar as those shown and described for the second layer. However, the material composition for the second layer and the fourth layer may be different, thereby forming an impedance mismatch between the second and fourth layers. Additionally, in some embodiments, respective thickness of the second layer and the fourth layer differs. Further, the fourth layer may include a different thickness as compared to the third layer. For example, in some embodiments, the fourth layer includes a thickness that is greater than that of the third layer. Moreover, in some embodiments, the fourth layer includes a thickness that is less than that of the second layer.

In step 1610, a fifth layer is applied to the fourth layer. In this regard, respective surfaces of the fourth layer and fifth layer may engage each other. Similar to the first and third layers, the fifth layer may include ITO or other electrically conductive particles. The third and fifth layers may be used as reflector layers, and radiation transmitted through one of the third and fifth can be repeatedly reflected between the third and fifth layers, thus allowing the radiation to be transmitted through and absorbed by the fourth layer. Similar to the second layer, the fourth layer can convert the radiation energy to thermal energy.

In order to increase the number of shields, flowchart 1600 can be repeated a desired number of times to, for example, create a stack of shields.

Various examples of aspects of the disclosure are described below as clauses for convenience. These are provided as examples, and do not limit the subject technology.

Clause A: A shield is described. The shield may include a first metal layer. The shield may further include a second metal layer coupled to the first metal layer, the second metal layer including ferrite powder. The shield may further include a third metal layer coupled to the second metal layer. In response to receiving electromagnetic radiation (EMR) energy: the first metal and the second metal are configured to reflect a first amount of the EMR energy transmitted through the first metal layer, and the ferrite powder is configured to absorb at least some of the first amount of EMR energy and convert the absorbed EMR energy into thermal energy.

Clause B: An assembly is described. The assembly may include a flexible circuit. The flexible circuit may include a dielectric material. The flexible circuit may further include transmission lines positioned in the dielectric material. The assembly may further include a ground plane overlaying the dielectric material. The assembly may further include a shield overlaying the ground plane. The shield may include a first metal layer. The shield may further include a second metal layer coupled to the first metal layer. The second metal layer may include ferrite particles. The shield may further include a third metal layer coupled to the second metal layer, wherein the second metal layer separates the first metal layer from the third metal layer.

Clause C: An electronic device is described. The electronic device may include a circuit board. The electronic device may further include an image sensor. The electronic device may further include a flexible circuit electrically coupled to the circuit board and the image sensor. The electronic device may further include a shield positioned on a surface of the flexible circuit. The shield may include a first layer including a first metal. The shield may further include a second layer coupled to the first layer, the second layer including a first plurality of ferrite powder. The shield may further include a third layer coupled to the second layer, the third layer including a second metal.

Clause D: A method for forming a shield is described. The method may include applying several layers of material through a deposition operation (e.g., thin film deposition). Each of the layers may include a metal layer. The method may include applying a first layer. The first layer may include ITO. The first layer may be applied directly to a circuit (e.g., flexible circuit, PCB) or to an assembly with an adhesive. The method may further include applying a second layer to the first layer. The second layer may include a powder, including spinel nano powder. The second layer may include a relatively high ferromagnetic resonance. The second layer may include Mn—Zn ferrite powder, Ni—Cu—Zn ferrite powder, Mg—Zn ferrite, ferrous oxide derivatives, super paramagnetic materials, or multiferroic materials. Further, the second layer may include a different thickness as compared to the first layer. The method may further include applying third layer to the second layer. The third layer may include ITO or other electrically conductive particles. The first and third layers may be used as reflector layers, and radiation transmitted through one of the first and third can be repeatedly reflected between the first and third layers, thus allowing the radiation to be transmitted through and absorbed by the second layer. The method may further include applying a fourth layer to the third layer. The fourth layer may include powder with materials similar to those in the second layer. The material composition for the second and fourth layers may be different, thereby forming an impedance mismatch between the second and fourth layers. The method may further include applying a fifth layer to the fourth layer. Similar to the first and third layers, the fifth layer may include ITO or other electrically conductive particles. The third and fifth layers may be used as reflector layers, and radiation transmitted through one of the third and fifth can be repeatedly reflected between the third and fifth layers, thus allowing the radiation to be transmitted through and absorbed by the fourth layer.

One or more of the above clauses can include one or more of the features described below. It is noted that any of the following clauses may be combined in any combination with each other, and placed into a respective independent clause, e.g., clause A, B, C or D.

Clause 1: wherein: the first metal layer overlays the second metal layer, and the second metal layer overlays the third metal layer.

Clause 2: further including: a fourth metal layer coupled to the third metal layer, the fourth metal layer including ferrite powder; and a fifth metal layer coupled to the fourth metal layer.

Clause 3: wherein: the third metal layer and the fifth metal layer are configured to reflect a second amount of the EMR energy that is transmitted by the second metal, and the ferrite powder in the fourth metal layer is configured to absorb at least some of the second amount of EMR energy that is reflected by the second metal and the third metal and convert the absorbed EMR energy into additional thermal energy.

Clause 4: wherein each of the first metal layer and the third metal layer includes indium tin oxide.

Clause 5: wherein: the third metal layer overlays the fourth metal layer, and the fourth metal layer overlays the fifth metal layer.

Clause 6: wherein each of the ferrite powder of the second metal layer and the ferrite powder of the fourth metal layer includes spinel nano ferrite powder.

Clause 7: wherein: the ferrite powder of the second metal layer includes a first molecular composition, and the ferrite powder of the fourth metal layer includes a second molecular composition different from the first molecular composition.

Clause 8: wherein: the first metal layer includes a first thickness, and the second metal layer includes a second thickness greater than the first thickness.

Clause 9: wherein the fourth metal layer includes a third thickness less than the second thickness.

Clause 10: wherein in response to exposure to electromagnetic radiation (EMR) energy: the first metal layer is configured to transmit at least some of the EMR energy, the first metal layer and the second metal layer are configured to reflect an amount of the transmitted EMR energy, and the ferrite particles are configured to absorb at least some of the reflected EMR energy and convert the absorbed EMR energy into thermal energy.

Clause 11: wherein the shield is configured to attenuate the EMR energy prior to exposure of the EMR energy to the transmission lines.

Clause 12: wherein: the transmission lines emit the EMR energy in response to carrying a signal, and the shield is configured to attenuate the EMR energy from the transmission lines.

Clause 13: wherein the shield further includes: a fourth metal layer coupled to the third metal layer, the fourth metal layer including ferrite particles; and a fifth metal layer coupled to the fourth metal layer.

Clause 14: wherein: the flexible circuit includes a connector electrically coupled to the flexible circuit, and the shield covers the connector.

Clause 15: wherein the shield further includes: a fourth layer coupled to the third layer, the second layer including a second plurality of ferrite powder; and a fifth layer coupled to the second layer, the fifth layer including a third metal.

Clause 16: wherein: the first plurality of ferrite powder includes a first impedance value based on a first molecular composition, the second plurality of ferrite powder includes a second impedance value based on a second molecular composition different from the first molecular composition, and the second impedance value is different from the first impedance value.

Clause 17: further including a hatched ground plane positioned between the shield and the flexible circuit.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

When an element is referred to herein as being "connected to," "coupled to," "overlaying," or "overlaid by" another element, it is to be understood that the elements can be directly connected to the other element, or have intervening elements present between the elements. In contrast, when an element is referred to as being "directly connected to," "directly coupled to," "directly overlaying," or "directly overlaid by" another element, it should be understood that no intervening elements are present in the "direct" connection between the elements. However, the existence of a direct connection does not exclude other connections, in which intervening elements may be present.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration". Any embodiment described herein as "exemplary" or as an "example" is not necessarily to be construed as preferred or advantageous over other embodiments. Furthermore, to the extent that the term "include", "have", or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An assembly, comprising:
a first shield, comprising:
 a first metal layer;
 a second metal layer coupled to the first metal layer, the second metal layer comprising ferrite powder; and
 a third metal layer coupled to the second metal layer, wherein in response to receiving electromagnetic radiation (EMR) energy:
  the first metal and the second metal are configured to reflect a first amount of the EMR energy transmitted through the first metal layer, and
  the ferrite powder is configured to absorb at least some of the first amount of EMR energy and convert the absorbed EMR energy into thermal energy;
a flexible circuit comprising:
 a dielectric material, and
 transmission lines positioned in the dielectric material; and
a first ground plane positioned between the first shield and the flexible circuit; and
a second shield, wherein the flexible circuit is positioned between the first shield and the second shield.

2. The assembly of claim 1, wherein:
the first metal layer overlays the second metal layer, and
the second metal layer overlays the third metal layer.

3. The assembly of claim 1, further comprising:
a fourth metal layer coupled to the third metal layer, the fourth metal layer comprising ferrite powder; and
a fifth metal layer coupled to the fourth metal layer.

4. The assembly of claim 3, wherein:
the third metal layer and the fifth metal layer are configured to reflect a second amount of the EMR energy that is transmitted by the second metal, and
the ferrite powder in the fourth metal layer is configured to absorb at least some of the second amount of EMR energy that is reflected by the second metal and the third metal and convert the absorbed EMR energy into additional thermal energy.

5. The assembly of claim 3, wherein each of the first metal layer and the third metal layer comprises indium tin oxide.

6. The assembly of claim 3, wherein:
the third metal layer overlays the fourth metal layer, and
the fourth metal layer overlays the fifth metal layer.

7. The assembly of claim 3, wherein each of the ferrite powder of the second metal layer and the ferrite powder of the fourth metal layer comprises spinel nano ferrite powder.

8. The assembly of claim 3, wherein:
the ferrite powder of the second metal layer comprises a first molecular composition, and
the ferrite powder of the fourth metal layer comprises a second molecular composition different from the first molecular composition.

9. The assembly of claim 1, wherein:
the first metal layer comprises a first thickness, and
the second metal layer comprises a second thickness greater than the first thickness.

10. The assembly of claim 9, further comprising a fourth metal layer, wherein the fourth metal layer comprises a third thickness less than the second thickness.

11. The assembly of claim 1, further comprising a second ground plane, wherein the flexible circuit is positioned between the first ground plane and the second ground plane.

12. The assembly of claim 11, wherein:
the first ground plane comprises a first hatched ground plane, and
the second ground plane comprises a second hatched ground plane.

13. The assembly of claim 11, wherein:
wherein the first metal layer is configured to transmit at least some of the EMR energy, and
the first shield is configured to attenuate the EMR energy prior to exposure of the EMR energy to the transmission lines.

14. The assembly of claim 11, wherein:
the transmission lines emit the EMR energy in response to carrying a signal, and
the first shield is configured to attenuate the EMR energy from the transmission lines.

15. The assembly of claim 11, wherein the first shield further comprises:
a fourth metal layer coupled to the third metal layer, the fourth metal layer comprising ferrite particles; and
a fifth metal layer coupled to the fourth metal layer.

16. An electronic device, comprising:
a circuit board;
an image sensor;
a flexible circuit electrically coupled to the circuit board and the image sensor; and
a shield first positioned on a surface of the flexible circuit, the first shield comprising:
 a first metal layer comprising a first metal;
 a second metal layer coupled to the first layer, the second layer comprising a first plurality of ferrite powder; and
 a third metal layer coupled to the second layer, the third layer comprising a second metal, wherein in response to receiving electromagnetic radiation (EMR) energy:
  the first metal and the second metal are configured to reflect a first amount of the EMR energy transmitted through the first metal layer, and
  the ferrite powder is configured to absorb at least some of the first amount of EMR energy and convert the absorbed EMR energy into thermal energy;
a flexible circuit comprising:
 a dielectric material, and
 transmission lines positioned in the dielectric material; and
a first ground plane positioned between the first shield and the flexible circuit; and
a second shield, wherein the flexible circuit is positioned between the first shield and the second shield.

17. The electronic device of claim 16, wherein:
the flexible circuit comprises a connector electrically coupled to the flexible circuit, and
the shield covers the connector.

18. The electronic device of claim 16, wherein the first shield further comprises:
a fourth metal layer coupled to the third layer, the fourth metal layer comprising a second plurality of ferrite powder; and
a fifth layer coupled to the second layer, the fifth layer comprising a third metal.

19. The electronic device of claim 18, wherein:

the first plurality of ferrite powder comprises a first impedance value based on a first molecular composition, the second plurality of ferrite powder comprises a second impedance value based on a second molecular composition different from the first molecular composition, and the second impedance value is different from the first impedance value.

20. The electronic device of claim 16, further comprising a hatched ground plane positioned between the first shield and the flexible circuit.

\* \* \* \* \*